US012784991B2

(12) United States Patent
Nad et al.

(10) Patent No.: US 12,784,991 B2
(45) Date of Patent: Nov. 3, 2026

(54) PACKAGE SUBSTRATE EMBEDDED MULTI-LAYERED IN VIA CAPACITORS

(71) Applicant: Intel Corporation, Santa Clara, CA (US)

(72) Inventors: Suddhasattwa Nad, Chandler, AZ (US); Kristof Darmawikarta, Chandler, AZ (US); Benjamin Duong, Phoenix, AZ (US); Gang Duan, Chandler, AZ (US); Srinivas Pietambaram, Chandler, AZ (US); Brandon Marin, Gilbert, AZ (US); Jeremy Ecton, Gilbert, AZ (US); Jason Steill, Phoenix, AZ (US); Thomas Sounart, Chandler, AZ (US); Darko Grujicic, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 18/090,305

(22) Filed: Dec. 28, 2022

(65) Prior Publication Data

US 2024/0222035 A1 Jul. 4, 2024

(51) Int. Cl.
*H01G 4/33* (2006.01)
*H01G 4/012* (2006.01)
(Continued)

(52) U.S. Cl.
CPC ............... *H01G 4/33* (2013.01); *H01G 4/012* (2013.01); *H01G 4/252* (2013.01);
(Continued)

(58) Field of Classification Search
CPC ........ H01G 4/012; H01G 4/018; H01G 4/228; H01G 4/252; H01G 4/33; H01G 4/35; H01G 4/38; H01G 4/40; H10W 70/095; H10W 70/63; H10W 70/635; H10W 70/685; H10W 70/686; H10W 70/687; H10W 90/00; H10W 90/701;
(Continued)

(56) References Cited

U.S. PATENT DOCUMENTS 10,269,894 B1 * 4/2019 Tsui ........................ H10D 1/716
2009/0161298 A1 * 6/2009 Lee .......................... H01G 9/15 361/525
2009/0309186 A1 * 12/2009 Inoue .................. H10W 20/498 257/532

OTHER PUBLICATIONS

Chen, Yu De, "Advanced Patterning Techniques for 3D Nand Devices", Coventor, a LAM Research Company,www.coventor.com/blog/advanced-patterning-techniques3d-nand-devices, Jul. 31, 2019.

* cited by examiner

*Primary Examiner* — Cheung Lee
(74) *Attorney, Agent, or Firm* — Essential Patents Group, LLP

(57) ABSTRACT

Apparatuses, capacitor structures, assemblies, and techniques related to package substrate embedded capacitors are described. A capacitor architecture includes a multi-layer capacitor structure at least partially within an opening extending through an insulative material layer of a package substrate or on a package substrate. The multi-layer capacitor structure includes at least two capacitor dielectric layers interleaved with a plurality of conductive layers such that the capacitor dielectric layers are at least partially within the opening and one of the conductive layers are on a sidewall of the opening.

21 Claims, 13 Drawing Sheets

(51) Int. Cl.

| | |
|---|---|
| ***H01G 4/252*** | (2006.01) |
| ***H10W 70/05*** | (2026.01) |
| ***H10W 70/63*** | (2026.01) |
| ***H10W 90/00*** | (2026.01) |
| *H01G 4/08* | (2006.01) |
| *H10W 40/22* | (2026.01) |
| *H10W 72/00* | (2026.01) |

(52) U.S. Cl.

CPC ....... *H10W 70/095* (2026.01); *H10W 70/635* (2026.01); *H10W 90/00* (2026.01); *H01G 4/085* (2013.01); *H10W 40/22* (2026.01); *H10W 72/877* (2026.01); *H10W 90/724* (2026.01); *H10W 90/731* (2026.01)

(58) Field of Classification Search

CPC ............. H10W 90/724; H10W 90/726; H10W 90/731; H10W 90/732; H10W 90/733; H10W 90/734; H10W 90/735; H10W 90/736; H10W 90/737; H10W 90/738; H10W 90/739

See application file for complete search history.

PACKAGE SUBSTRATE EMBEDDED MULTI-LAYERED IN VIA CAPACITORS

BACKGROUND

Higher performance, lower cost, increased miniaturization, and greater packaging density of integrated circuits within integrated circuit devices are ongoing goals of the electronics industry. As these goals are achieved, power delivery continues to be an area of interest. Next generation products require passive devices to be integrated into the system for power delivery applications. Current passive device deployment, including passive capacitor architectures, do not meet the needs for miniaturization, density, and integration that are needed for product improvement. It is with respect to these and other considerations that the present improvements have been needed. Such improvements may become critical as the desire to deploy advanced memory solutions becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
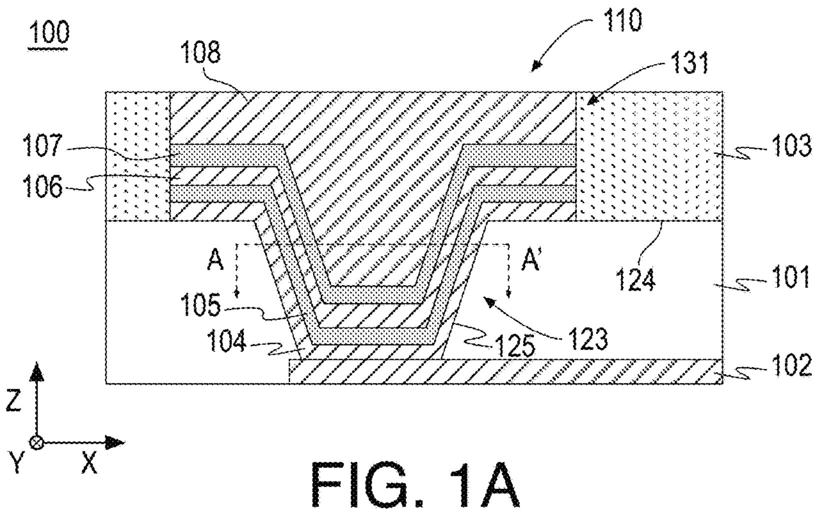
FIG. 1A provides a cross-sectional view illustrating an example multi-layered in package opening capacitor structure.

One or more embodiments or implementations are now described with reference to the enclosed figures. While specific configurations and arrangements are discussed, this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other.

Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

The term "package" generally refers to a self-contained carrier of one or more dice, where the dice are attached to the package substrate, and may be encapsulated for protection, with integrated or wire-boned interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit. Here, the term "dielectric" and the term "insulative and any similar term generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate. Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric. Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together. Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, magnetic or fluidic connection between the things that are connected or an indirect connection, through one or more passive or active intermediary devices.

Apparatuses, systems, capacitor structures, and techniques are described herein related to package substrate embedded multi-layered in via capacitors.

As discussed, it is desirable to efficiently deliver power to assemblies including package substrates. However current passive device deployment, including passive capacitor architectures, do not meet the needs for miniaturization, density, and integration. For example, it is desirable to provide high density capacitors that are integrated into the build up process of a package and/or package substrate. The techniques and architectures discussed herein deploy a capacitor in blind via architecture. In some embodiments, metal and dielectric films are sequentially deposited in a blind via to fabricate an in-situ multi-layered capacitor. In some embodiments, each metal layer of the multi-layered capacitor structure is contacted by a separate terminal. For example, a multi-layered capacitor structure is etched by a staircase etch process to create an integrated variable capacitor. The discussed techniques and architectures offer a variety of advantages including increased capacitance, fabrication of variable capacitance in via capacitors, and improved variability of capacitance by in glass core and/or glass carrier based architectures.

FIG. 1A provides a cross-sectional view illustrating an example multi-layered in package opening capacitor structure 100, arranged in accordance with at least some implementations of the present disclosure. As shown in FIG. 1A, multi-layered in package opening capacitor structure 100 includes an insulative material layer 101 that may be a portion of a package substrate or a build-up layer over or on the package substrate. Herein, the term build-up layer indicates one or more materials and/or structures built up over a package substrate. In some embodiments, the build-up layer is a thick layer of deposited dielectric layer. In some embodiments, the build-up layer is a build-up substrate optionally including multiple layers of circuitry, such as an ABF substrate layer or layers.

Figure 1B:
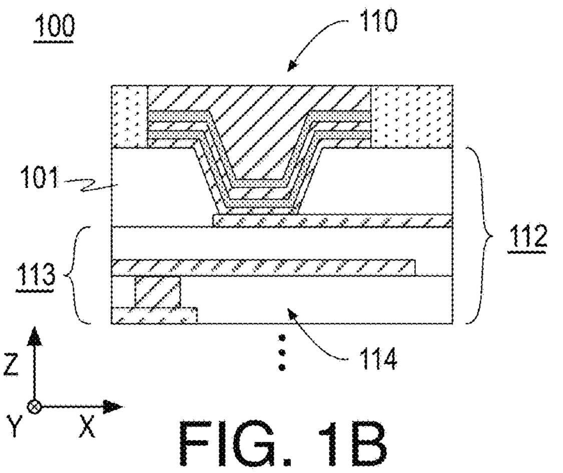
FIG. 1B provides a cross-sectional view illustrating an expanded view of the example multi-layered in via capacitor structure of FIG. 1 to illustrate package substrate architectures.

FIG. 1B provides a cross-sectional view illustrating an expanded view of example multi-layered in package opening capacitor structure 100 to illustrate package substrate architectures, arranged in accordance with at least some implementations of the present disclosure. As shown in FIG. 1B, insulative material layer 101 may be a portion of a package substrate 112. For example, insulative material layer 101 may be a portion of a package substrate core. Here, the term "cored" or "core" generally refers to a substrate of an integrated circuit package built upon a board, card or wafer comprising a non-flexible stiff material. Typically, a small, printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

In contexts where insulative material layer 101 is a portion of package substrate 112, package substrate 112 may include any suitable organic or inorganic material. In some embodiments, package substrate 112 is an interposer. In some embodiments, package substrate 112 is an inorganic substrate material such as glass. For example, package substrate 112 may be a glass core substrate or a glass carrier based substrate. Package (or electronic) substrate 112 may include a number of dielectric material layers inclusive of insulative material layer 101 Such dielectric material layers may be composed of an appropriate dielectric material(s), including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

In some embodiments, insulative material layer 101 is a build-up layer over a package substrate 113 such as a package substrate core. Package substrate 113 may have any characteristics discussed with respect to package substrate 112. In such contexts, insulative material layer 101 may include build-up films and/or solder resist layers and may be composed of an appropriate dielectric material(s), including those discussed above, such as bismaleimide triazine resin, fire retardant grade 4 material, polyimide material, silica filled epoxy material, glass reinforced epoxy material, low-k, carbon doped dielectrics, fluorine doped dielectrics, porous dielectrics, organic polymeric dielectrics, and the like. In some embodiments, the package substrate is a glass. As shown, package substrate 112 or package substrate 113 may include any number of metallization layers and features 114 inclusive of buried vias, through vias, and the like.

Returning to FIG. 1A, a multi-layered capacitor structure 110 is formed at least partially within an opening 123 of insulative material layer 101. Multi-layered capacitor structure 110 may also be partially embedded in a dielectric layer 103. Multi-layered capacitor structure 110 may be characterized as a capacitor, a multi-layered capacitor, or the like. It is noted that any number of multi-layered capacitor structures 110 may be formed in insulative material layer 101 (e.g., arrayed across a top surface 124 of insulative material layer 101) and insulative material layer 101 may include any number of other metallization structures such as conductive vias. As used herein, the term conductive via indicates a conductor extending through a via. The term via indicates an opening, typically having a circular cross section that extends at least partially through a material layer. As shown in FIG. 1A, in some embodiments, edge sidewalls 131 of conductive layers 104, 106, 108 and capacitor dielectric layers 105, 107 are vertically aligned Furthermore, multi-layered capacitor structure 110 contacts a metallization layer 102 under insulative material layer 101. Metallization layer 102 may be characterized as a buried metallization layer, a conductive base layer, or the like. When a conductive via extends from a top surface 124 of insulative material layer 101 to a buried metallization layer 102, it may be characterized as a blind via. Therefore, multi-layered capacitor structure 110 may be characterized as an in-blind-via capacitor or simply as an in via capacitor. As discussed below, metallization layer 102 may provide a terminal of multi-layered capacitor structure 110.

Multi-layered capacitor structure 110 is at least partially within opening 123, which extends through insulative material layer 101. That is, opening 123 extends from top surface 124 of insulative material layer 101 (e.g. a top surface opening), through insulative material layer 101, to metallization layer 102 (e.g. a bottom opening). As shown, in some embodiments, opening 123 has a sloped sidewall 125 that slopes inwardly from top surface 124 to metallization layer 102 such that the top surface opening is larger than the bottom opening. In some embodiments, opening 123 has substantially vertical sidewalls.

Multi-layered capacitor structure 110 includes two or more capacitor dielectric layers 105, 107 interleaved with a number of conductive layers 104, 106, 108 such that, in some embodiments, a bottom conductive layer 104 and a top conductive layer 108 are provided and the two or more capacitor dielectric layers 105, 107 are on conductive layers 104, 108 and one or more intervening conductive layers 106 are interleaved with the two or more capacitor dielectric layers 105, 107. Here, the term interleaved indicates the dielectric and conductive layers are alternating. Furthermore, bottom conductive layer 104 is on sidewall 125 of opening 123. Although illustrated herein with two or more capacitor dielectric layers 105, 107, any number may be used such as three, four, or more. It is noted that the number of internal conductive layers (i.e., those conductive layers other than bottom conductive layer 104 and top conductive layer 108) is one less than the number of capacitor dielectric layers 105, 107.

In some embodiments, as discussed below, a variable or multi-terminal capacitor is provided using two or more capacitor dielectric layers 105, 107 and conductive layers 104, 106, 108. For example, each of conductive layers 104, 106, 108 may provide a separate terminal such that different capacitances may be achieved using the same multi-layered capacitor structure. However, in the context of multi-layered capacitor structure 110, the one or more internal conductive layers 106 increase the capacitance of multi-layered capacitor structure 110, as is known in the art.

Conductive layers 104, 106, 108 may be any suitable conductive materials. Conductive layers 104, 106, 108 may be the same materials or they may differ. In some embodiments, conductive layers 104, 106, 108 include one or more metals. In some embodiments, conductive layers 104, 106, 108 are advantageously copper. However, other metals may be used such as gold, silver, tungsten, and platinum. Similarly, capacitor dielectric layers 105, 107 may be any suitable dielectric materials. Capacitor dielectric layers 105, 107 may be the same materials or they may be different. In some embodiments, one or both of capacitor dielectric layers 105, 107 is a silicon oxide material (e.g., silicon and oxygen). In some embodiments, one or both of capacitor dielectric layers 105, 107 is a silicon nitride material (e.g., silicon and nitrogen). In some embodiments, one or both of capacitor dielectric layers 105, 107 is a silicon oxynitride material (e.g., silicon, oxygen, and nitrogen). In some embodiments, one or both of capacitor dielectric layers 105, 107 is a hafnium oxide material (e.g., hafnium and oxygen). In some embodiments, one or both of capacitor dielectric layers 105, 107 is a zirconium oxide material (e.g., zirconium and oxygen). In some embodiments, one or both of capacitor dielectric layers 105, 107 is a hafnium zirconium oxide material (e.g., hafnium, zirconium, and oxygen). Other dielectric materials may be used. Conductive layers 104, 106, 108 and capacitor dielectric layers 105, 107 may have any suitable thicknesses. In some embodiments, conductive layers 104, 106, 108 have thicknesses in the range of 0.5 to 10 microns. In some embodiments, capacitor dielectric layers 105, 107 have thicknesses in the range of 5 nm to 10 microns. In some embodiments, capacitor dielectric layers 105, 107 have thicknesses in the range of 5 to 100 nm.

As shown, multi-layered capacitor structure 110 is at least partially within opening 123 such that at least portions of two or more capacitor dielectric layers 105, 107 and conductive layers 104, 106, 108 are within opening 123 and such that two or more capacitor dielectric layers 105, 107 have a shape profile that approximates that of opening 123. Furthermore, each of capacitor dielectric layers 105, 107 and conductive layers 104, 106, 108 may extend over top surface 124, as shown, to provide a bond pad or landing pad for coupling to multi-layered capacitor structure 110. An outer edge of capacitor dielectric layers 105, 107 and conductive layers 104, 106, 108 may extend beyond opening 123 by any suitable distance such as a distance in the range of 20 to 500 microns. Opening 123 may have any suitable shape in the x-y plane.

Figure 1C:
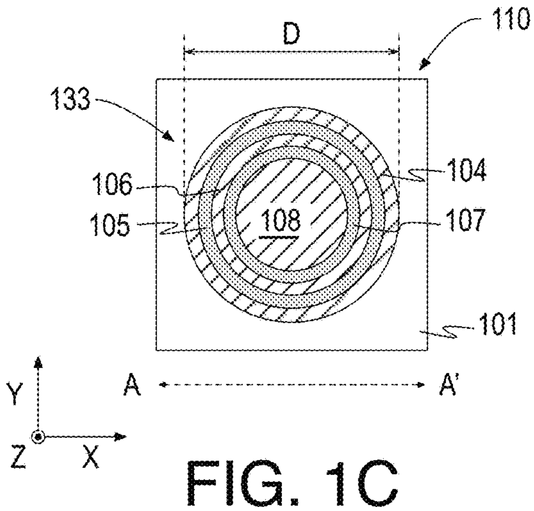
FIG. 1C provides a cross-sectional downward looking view of an example multi-layered capacitor structure formed in a via opening having a substantially circular cross section.

FIG. 1C provides a cross-sectional downward looking view of an example multi-layered capacitor structure 110 formed in a via opening having a substantially circular cross section, arranged in accordance with at least some implementations of the present disclosure. For example, FIG. 1C illustrates the cross-sectional downward looking view taken at A-A' in FIG. 1A in the context of multi-layered capacitor structure 110 being formed in a via opening 133. As shown in FIG. 1C, in some embodiments, multi-layered capacitor structure 110 is formed in via opening 133 having a substantially circular cross section. In such embodiments, via opening 133 may be formed using stationary laser drilling or patterning and etch techniques. Via opening 133 may have any suitable diameter, D, such as a diameter in the range of about 20 microns to about 100 microns, or more. Other suitable dimensions may be used. Conductive layers 104, 106, 108 and capacitor dielectric layers 105, 107 are substantially conformal to via opening 133. As discussed, via opening 133 may have a sloped sidewall 125 in some embodiments.

Figure 1D:
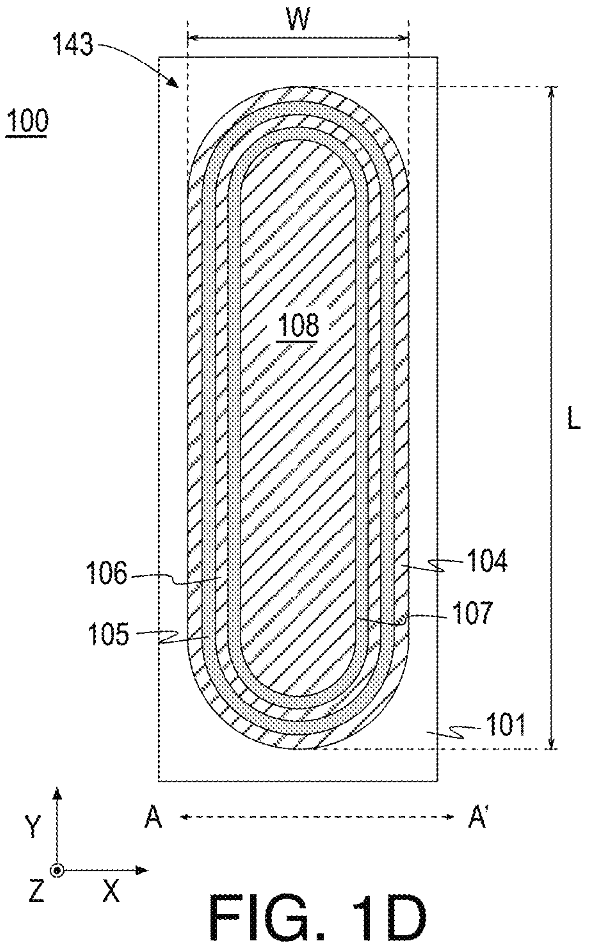
FIG. 1D provides a cross-sectional downward looking view of an example multi-layered capacitor structure formed in a trench opening having an elongated cross section.

FIG. 1D provides a cross-sectional downward looking view of an example multi-layered capacitor structure 110 formed in a trench opening having an elongated cross section, arranged in accordance with at least some implementations of the present disclosure. For example, FIG. 1D also illustrates the cross-sectional downward looking view taken at A-A' in FIG. 1A in the context of multi-layered capacitor structure 110 being formed in a trench opening 143 extending in the y-dimension. As shown in FIG. 1D, in some embodiments, multi-layered capacitor structure 110 is formed in trench opening 143 having a substantially stadium cross-sectional shape. In such embodiments, trench opening 143 may be formed using a laser drilling where drilling processes in the y-dimension, or patterning and etch techniques. As shown, trench opening 143 has a length, L, and a substantially orthogonal width, W, such that the length is greater than the width. In some embodiments, the length is not less than twice the width. In some embodiments, the length is not less than three times the width. In some embodiments, the length is not less than four or five times the width. Other aspect ratios may be used. Trench opening 143 may have any suitable width (and corresponding length in accordance with the discussed ratios). For example, the width may be in the range of about 20 microns to about 100 microns, or more. Other suitable dimensions may be used. Conductive layers 104, 106, 108 and capacitor dielectric layers 105, 107 are substantially conformal to trench opening 133, which may have a sloped sidewall 125 in some embodiments.

Figure 1E:
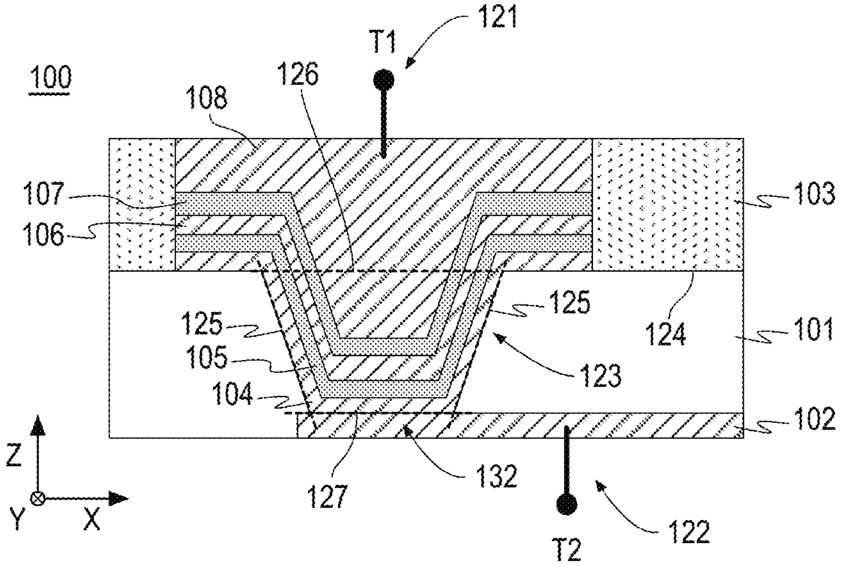
FIG. 1E provides a cross-sectional view illustrating example multi-layered in package opening capacitor structure similar to that of FIG. 1A further illustrating terminal connections and an opening volume.

FIG. 1E provides a cross-sectional view illustrating example multi-layered in package opening capacitor structure 100 similar to that of FIG. 1A further illustrating terminal connections and an opening volume, arranged in accordance with at least some implementations of the present disclosure. As discussed, multi-layered capacitor structure 110 is at least partially within opening 123 such that at least portions of two or more capacitor dielectric layers 105, 107 and conductive layers 104, 106, 108 are within opening 123. As shown in FIG. 1E, a volume of opening 123 may be defined by a top opening 126, sidewall 125, and a bottom opening 127. For example, top opening 126 (now filled) is defined as a shape in the x-y plane coplanar with top surface 124 and surrounded by the material of insulative material layer 101. Similarly, bottom opening 127 (now filled) is defined as a shape in the x-y plane coplanar with a top surface 132 of metallization layer 102 and surrounded by the material of insulative material layer 101. Finally, sidewall 125 comprises a wall of the material of insulative material layer 101 surrounding opening 123 and extending between bottom opening 127 and top opening 126. As shown, the volume defined by bottom opening 127, top opening 126, and sidewall 125 includes a portion of each of conductive layers 104, 106, 108 and each of capacitor dielectric layers 105, 107, in some embodiments. In some embodiments, one or more layers may also be formed over the defined volume of opening 123. For example, a top conductive layer 108 may be formed entirely over opening 123.

Furthermore, FIG. 1E illustrates terminals 121 (T1) and 122 (T2) coupled to multi-layered capacitor structure 110. Terminal 121 may include conductive layer 108 and/or a metal via, a metallization line, a solder bump, a bond pad of an external device, or the like. Terminal 122 may include conductive layer 104 and/or metallization layer 102, a buried via, a metallization line, wiring, or the like. For example, multi-layered capacitor structure 110 may be contacted using any suitable circuitry to incorporated multi-layered capacitor structure 110 into a packaged device by contacting by an integrated circuit, a discrete device, or the like.

Figure 2A:
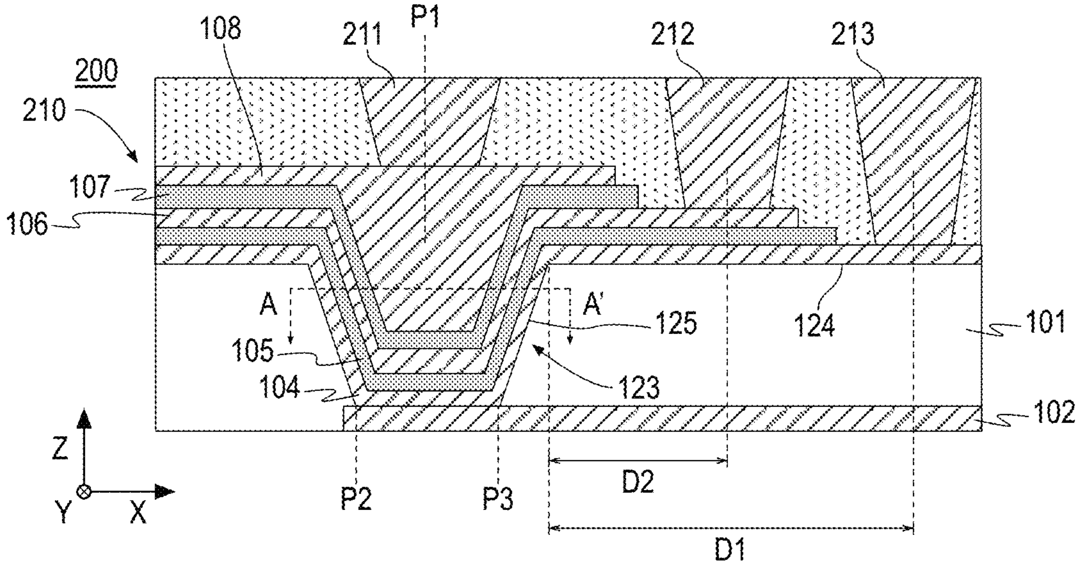
FIG. 2A provides a cross-sectional view illustrating an example multi-layered in package opening variable capacitor structure.

FIG. 2A provides a cross-sectional view illustrating an example multi-layered in package opening variable capacitor structure 200, arranged in accordance with at least some implementations of the present disclosure. In FIG. 2A, and elsewhere herein, like numerals are used to indicate like structures, and such like structures may have any characteristics discussed herein. As shown in FIG. 2A, multi-layered in package opening variable capacitor structure 200 includes insulative material layer 101, which may be a portion of a package substrate or a build-up layer over or on the package substrate, as discussed with respect to FIG. 1B.

Multi-layered in package opening variable capacitor structure 200 further includes a multi-layered capacitor structure 210 that is formed at least partially within opening 123 of insulative material layer 101. Multi-layered capacitor structure 210 may be characterized as a capacitor, a multi-layered capacitor, or the like. Any number of multi-layered capacitor structures 210 may arrayed across top surface of insulative material layer 101 and insulative material layer 101 may include additional metallization structures such as conductive vias. As shown conductive layer 104 of multi-layered capacitor structure 110 contacts metallization layer 102 under insulative material layer 101.

As with multi-layered capacitor structure 110, multi-layered capacitor structure 210 is at least partially within opening 123, which extends through insulative material layer 101. As discussed, opening 123 extends from top surface 124 of insulative material layer 101 (e.g. a top surface opening), through insulative material layer 101, to metallization layer 102 (e.g. a bottom opening). In some embodiments, opening 123 has a sloped sidewall 125 that slopes inwardly from top surface 124 to metallization layer 102 such that the top surface opening is larger than the bottom opening.

Multi-layered capacitor structure 210 includes two or more capacitor dielectric layers 105, 107 interleaved with conductive layers 104, 106, 108 as discussed herein such a bottom conductive layer 104 and a top conductive layer 108 are provided and the two or more capacitor dielectric layers 105, 107 are on conductive layers 104, 108 and one or more intervening conductive layers 106 are interleaved with the two or more capacitor dielectric layers 105, 107. Furthermore, bottom conductive layer 104 is on sidewall 125 of opening 123. Although illustrated herein with two or more capacitor dielectric layers 105, 107, any number may be used such as three, four, or more.

Notably, conductive layer 104 extends along and over top surface 124 to couple to a conductive via 213, which lands on conductive layer 104, conductive layer 106 extends along and over top surface 124 to couple to a conductive via 212, which lands on conductive layer 106, and conductive layer 108 couples to a conductive via 211, which lands on conductive layer 108. As shown, a conductive via (i.e., a metal via) separately contacts each of conductive layers 104, 106, 108 as enabled by the staircase architecture of multi-layered capacitor structure 210.

For example, conductive via 213 is in contact with conductive layer 104 at a distance, D1, from opening 123 along top surface 124 of insulative material layer 101. Also as shown, conductive via 212 is in contact with conductive layer 106 at a distance, D2, from opening 123 along top surface 124 of insulative material layer 101 such that distance D2 is less than distance D1. In the illustrated example, distances D1, D2 are measured from an edge of opening 123 to centerlines of conductive vias 213, 212, along the x-dimension. However, distances D1, D2 may be measured from any suitable landmarks of opening 123 and conductive vias 213, 212. Furthermore, conductive via 211 is in contact with conductive layer 108 at a position, P1, above opening 123. For example, position P1 may be at a centerline of opening 123. In the example of FIG. 2A, metallization layer 102 also couples to conductive layer 104 at a position, between positions P2 and P3, below opening 123.

Conductive layers 104, 106, 108 may be any suitable conductive materials and capacitor dielectric layers 105, 107 may be any suitable dielectric materials as discussed above. Similarly, conductive layers 104, 106, 108 and capacitor dielectric layers 105, 107 may have any suitable thicknesses and other characteristics discussed herein. As shown, multi-layered capacitor structure 210 is at least partially within opening 123. Opening 123 may be a via opening, having characteristics discussed with respect to via opening 133, or a trench opening, having characteristics discussed with respect to trench opening 143. Furthermore, opening 123 may have any characteristics discussed with respect to FIG. 1E.

Figure 2B:
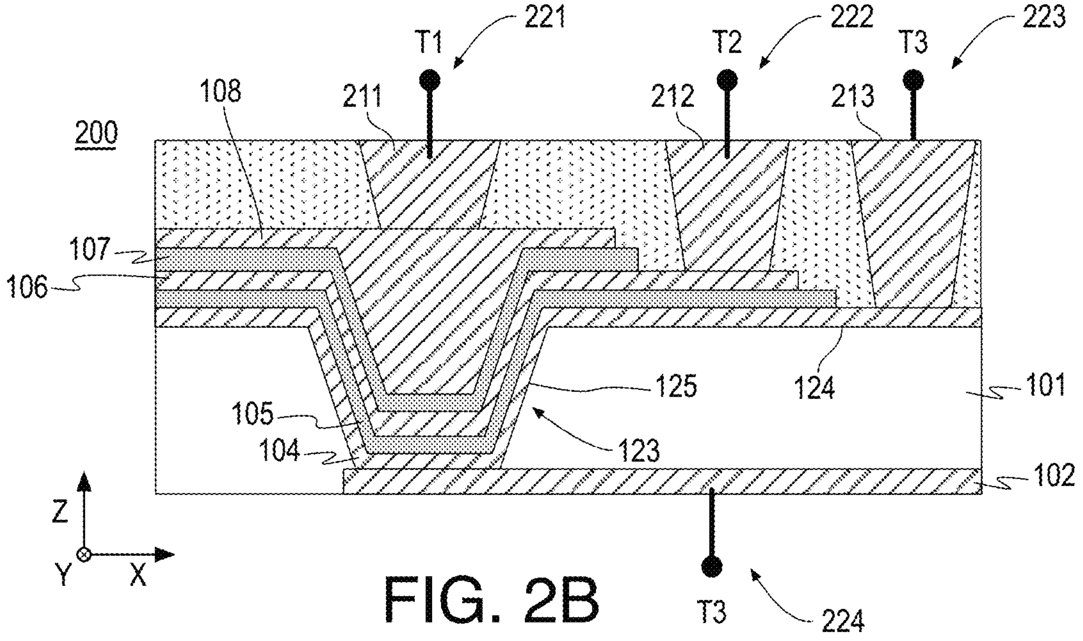
FIG. 2B provides a cross-sectional view illustrating example multi-layered in package opening variable capacitor structure similar to that of FIG. 2A further illustrating terminal connections.

FIG. 2B provides a cross-sectional view illustrating example multi-layered in package opening variable capacitor structure 200 similar to that of FIG. 2A further illustrating terminal connections, arranged in accordance with at least some implementations of the present disclosure. As shown in FIG. 2B, terminals 221 (T1), 222 (T2), 223 (T3), and 224 (T3) are coupled to multi-layered capacitor structure 110. Notably, in the architecture of FIG. 2B, conductive layer 104 couples with both terminal 224 (via metallization layer 102) and terminal 223 (via conductive via 213) and therefore share the same terminal identifier T3. In other embodiments, conductive layer 104 couples to only one terminal.

Terminal 221 may include conductive layer 108 and/or conductive via 211, a metallization line, a solder bump, or a bond pad of an external device, terminal 222 may include conductive layer 106 and/or conductive via 212, a metallization line, a solder bump, or a bond pad of an external device, and terminal 223 may include conductive layer 104 and/or conductive via 213, a metallization line, a solder bump, or a bond pad of an external device. Terminal 224 may include conductive layer 104 and/or metallization layer 102, a buried via, a metallization line, wiring, or the like. Other terminal circuitry may be used.

By deploying such multiple terminals, multi-layered capacitor structure 210 provides a variable or multiple state capacitor as follows. A first capacitance can be stored by coupling to multi-layered capacitor structure 210 via terminals T1 and T2, a second capacitance can be stored by coupling to multi-layered capacitor structure 210 via terminals T1 and T3, and a third capacitance can be stored by coupling to multi-layered capacitor structure 210 via terminals T2 and T3. For example, multi-layered capacitor structure 210 may store a number of capacitances equal to the number of capacitor dielectric layers 105, 107 plus one. Such architectures offer the advantages of flexibility and device density.

Figure 3:
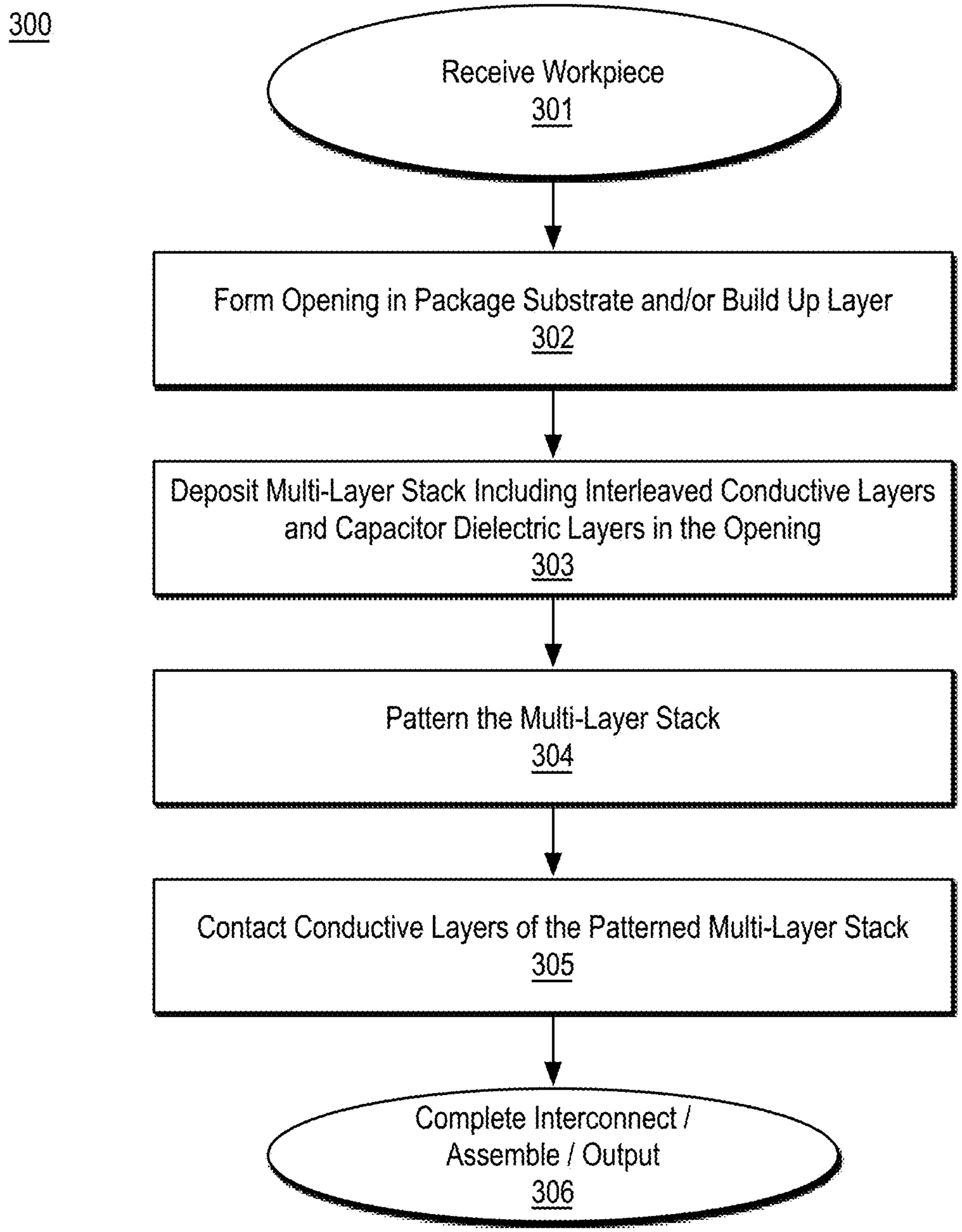
FIG. 3 is a flow diagram illustrating methods for forming a multi-layered in package opening capacitor structure.

FIG. 3 is a flow diagram illustrating methods 300 for forming a multi-layered in package opening capacitor structure, arranged in accordance with some embodiments of the disclosure. Methods 300 may be practiced, for example, to fabricate any of capacitor structures 100, 200, 406, or 517. FIGS. 4A, 4B, 4C, 4D, 4E, and 4F are cross-sectional views of a two-terminal capacitor structure evolving as methods 300 are practiced, arranged in accordance with some embodiments of the disclosure. FIGS. 5A, 5B, 5C, 5D, 5E, 5F, 5G, 5H, 5I, 5J, 5K, and 5L are cross-sectional views of a multi-terminal capacitor structure evolving as methods 300 are practiced, arranged in accordance with some embodiments of the disclosure.

Methods 300 begin at input operation 301, where a workpiece including a package substrate and/or a build-up layer on a package substrate is received. The workpiece includes a insulative material layer that is part of the package substrate or formed on the package substrate. The package substrate may include any materials discussed herein and may have any suitable format or architecture. For example, the package substrate may be an interposer, board, or the like, and integrated circuit devices may be ultimately mounted to the package substrate for deployment in an electronic device. Processing continues at operation 302, where an opening is formed in at least the insulative material layer of the package substrate. For example, an opening 123, 133, 143 may be formed in the insulative material layer using any suitable technique or techniques including laser drilling, patterning and etch techniques, mechanical drilling, or the like. In some embodiments, the opening exposes an underlying metallization layer that a capacitor is to land on. For example, the metallization layer may be a terminal of the capacitor.

Processing continues at operation 303, where a multi-layer stack including interleaved conductive and capacitor dielectric layers are deposited, plated, etc. at least partially within the opening, and at operation 304, where the multi-layer stack is patterned to form a capacitor structure. For example, operations 303 and 304 may be performed in concert to fabricate a capacitor structure as discussed herein below. In some embodiments, each layer of the multi-layer stack is formed and the multi-layer stack is subsequently patterned to form the capacitor structure. In some embodiments, one or more individual layers of the multi-layer stack are patterned after they are formed. Exemplary techniques are discussed herein with respect to FIGS. 4C-4F and FIGS. 5B-5K herein below.

Processing continues at operation 305, where one or more outer conductive layers of the patterned multi-layer stack (i.e., the capacitor structure) are contacted to provide electrical routing or circuitry to the capacitor structure. In some embodiments, a bottom conductive layer contacted a buried metallization layer exposed at operation 301 and operation 303 includes contacting one or more top conductive layers of the capacitor structure using conductive vias.

Processing continues at operation 306, where any remaining interconnect features, including dielectric deposition, metallization routing, and the like may be competed, the package substrate may be assembled by affixing integrated circuit dies and other processing, the resultant structure maybe output. In some embodiments, the terminals coupled to the capacitor structure are bonded to integrated circuit dies or other circuitry and the package substrate is assembled into an assembly including the integrated circuit dies, the package substrate, an optional board such as a motherboard, and optional thermal solutions, as is known in the art. The assembly or package substrate may then be installed in any suitable electronic device such as a laptop, a netbook, a notebook, an ultrabook, a smartphone, a tablet, a personal digital assistant PDA, an ultra-mobile PC, a mobile phone, a desktop computer, a server, a printer, a scanner, a monitor, a set-top box, an entertainment control unit, a digital camera, a portable music player, a digital video recorder, or the like.

Figure 4A:
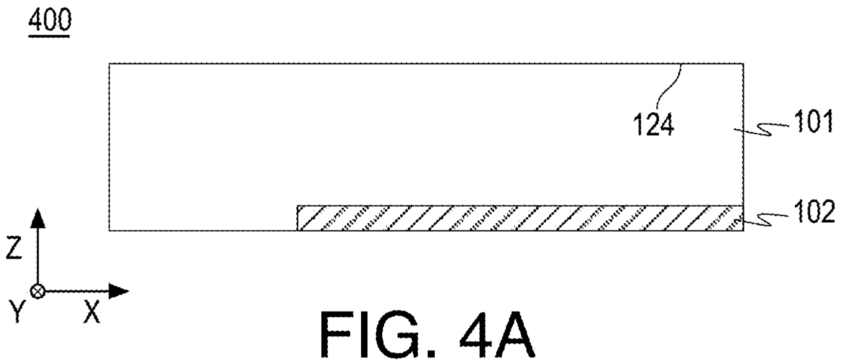
FIGS. 4A, 4B, 4C, 4D, 4E, and 4F are cross-sectional views of a two-terminal capacitor structure evolving as the methods of FIG. 3 are practiced.

FIG. 4A is a cross-sectional view of a capacitor structure 400 illustrating a received workpiece. As shown, capacitor structure 400 includes insulative material layer 101 and a metallization layer 102 such that, in the illustrated example, metallization layer 102 is buried under insulative material layer 101. Insulative material layer 101 may have any characteristics discussed herein. For example, insulative material layer 101 may be a portion of a package substrate or insulative material layer 101 may be a build-up layer on or over a package substrate as discussed with respect to FIG. 1B and elsewhere herein.

Figure 4B:
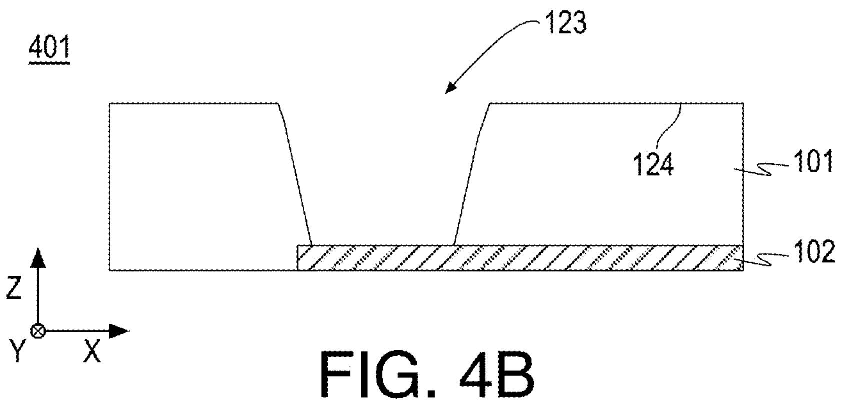

FIG. 4B is a cross-sectional view of a capacitor structure 401 similar to capacitor structure 400 after formation of opening 123 in insulative material layer 101. Opening 123 may be formed using any suitable technique or techniques including laser drilling, patterning and etch techniques, or mechanical drilling. As shown, formation of opening 123 may reveal metallization layer 102, which may provide a terminal of the ultimate capacitor structure.

Figure 4C:
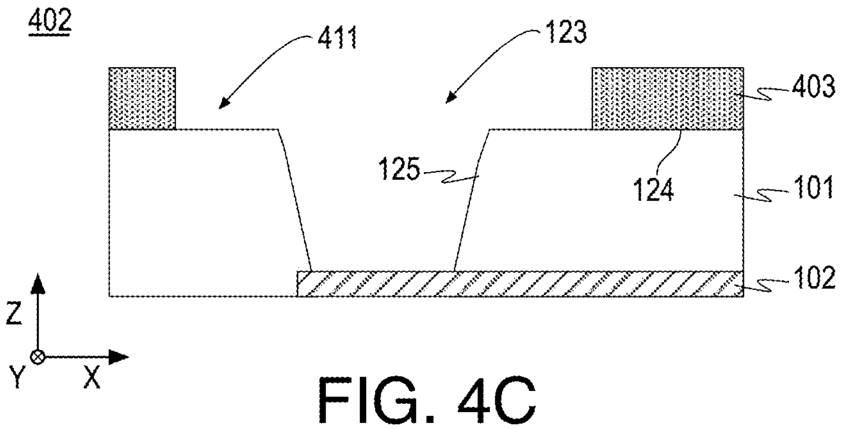

FIG. 4C is a cross-sectional view of a capacitor structure 402 similar to capacitor structure 401 after formation of patterned layer 403 on or over top surface 124 of insulative material layer 101. Patterned layer 403 may include any suitable materials including dry film resist. Patterned layer 403 may be formed using any suitable technique or techniques such as formation of a bulk material layer (e.g., dry film lamination) and patterning (e.g., exposure and removal of the exposed or unexposed regions). As shown, in some embodiments, patterned layer 403 exposes opening 123 and a region 411 of top surface 124 of insulative material layer 101. For example, it may be desirable for the geometry of the ultimate capacitor structure to have a top landing area (e.g., for an outside device) that is larger than opening 123.

Figure 4D:
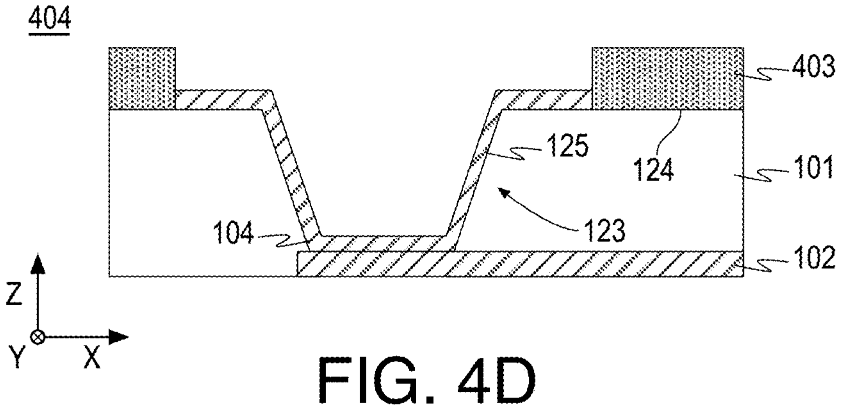

FIG. 4D is a cross-sectional view of a capacitor structure 404 similar to capacitor structure 402 after formation of conductive layer 104 within the opening defined by patterned layer 403. Conductive layer 104 may be any material(s) and may have any characteristics discussed herein. Conductive layer 104 may be formed using any suitable technique or techniques such as electroplating techniques. In some embodiments, a seed layer is formed prior to application of patterned layer 403 to facilitate such electroplating.

Figure 4E:
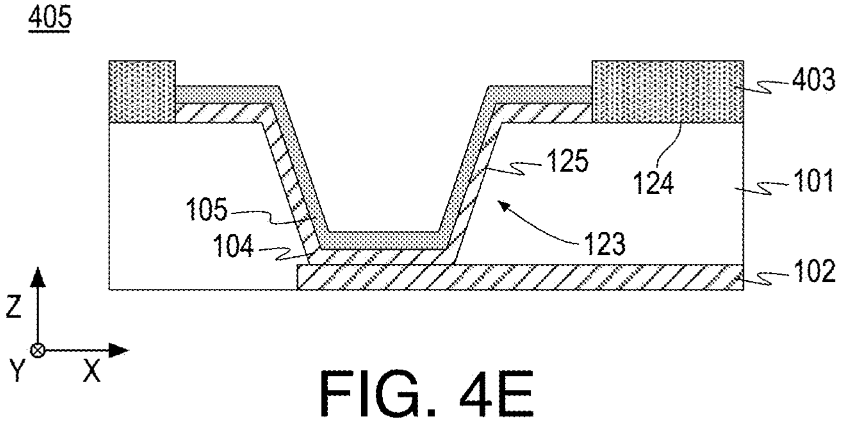

FIG. 4E is a cross-sectional view of a capacitor structure 405 similar to capacitor structure 404 after formation of capacitor dielectric layer 105 on conductive layer 104. Capacitor dielectric layer 105 may be any material(s) and may have any characteristics discussed herein. Capacitor dielectric layer 105 may be formed using any suitable technique or techniques. In some embodiments, capacitor dielectric layer 105 is formed only on conductive layer 104 using selective deposition techniques. Alternatively, capacitor dielectric layer 105 may be blanked deposited and a secondary mask may be used to etch back the blanket deposited material to provide capacitor dielectric layer 105. In some embodiments, the material of capacitor dielectric layers 105, 107 is advantageously a material that may be readily deposited using chemical vapor deposition (CVD) or physical vapor deposition (PVD).

Figure 4F:
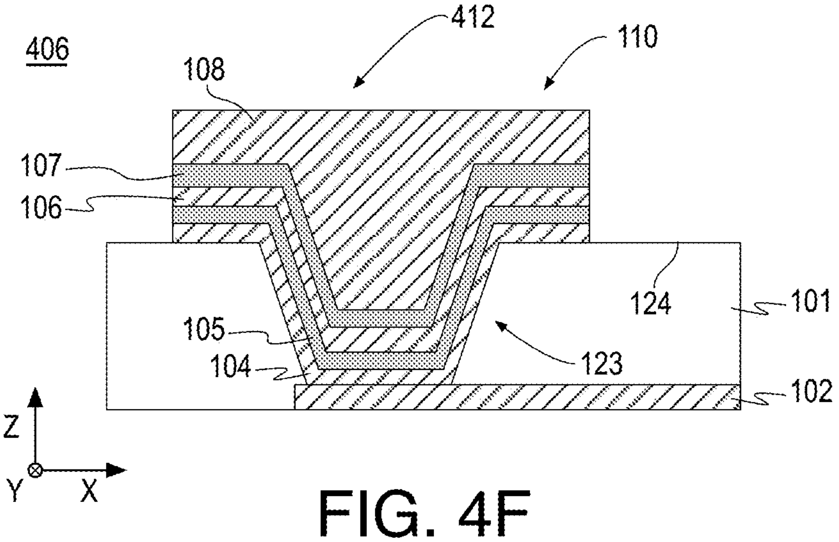

FIG. 4F is a cross-sectional view of a capacitor structure 406 similar to capacitor structure 405 after formation of conductive layer 106, capacitor dielectric layer 107, and conductive layer 108, and removal of patterned layer 403. Conductive layer 106, capacitor dielectric layer 107, and conductive layer 108 may be formed using any suitable technique or techniques discussed with respect to conductive layer 104 and capacitor dielectric layer 105. In some embodiments, secondary masks are deployed to pattern conductive layer 106, capacitor dielectric layer 107, and/or conductive layer 108. As shown, the final conductive layer 108 may be built up to include a substantially planar top surface 412, which may aid in bonding to an integrated circuit die. Furthermore, capacitor structure 406 may be further processed to form dielectric layer 103. For example, dielectric layer 103 may be blanket deposited and planarized. Dielectric layer 103 may be any suitable dielectric material or materials.

Figure 5A:
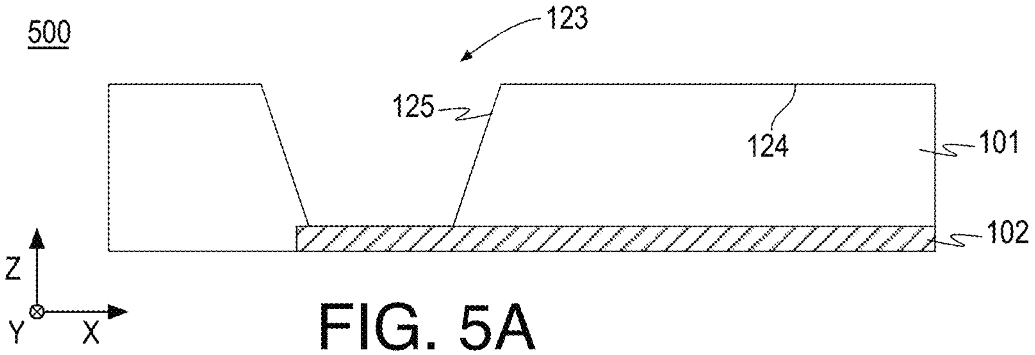
FIGS. 5A, 5B, 5C, 5D, 5E, 5F, 5G, 5H, 5L, 5J, 5K, and 5L are cross-sectional views of a multi-terminal capacitor structure evolving as the methods of FIG. 3 are practiced.

FIG. 5A is a cross-sectional view of a capacitor structure 500 similar to that of capacitor structure 401 (refer to FIG. 4B). For example, a workpiece may be received such that the workpiece includes insulative material layer 101 and metallization layer 102 such that is buried under insulative material layer 101. Opening 123 is then formed using any suitable technique or techniques including laser drilling, patterning and etch techniques, or mechanical drilling such that opening 123 may reveal metallization layer 102.

Figure 5B:
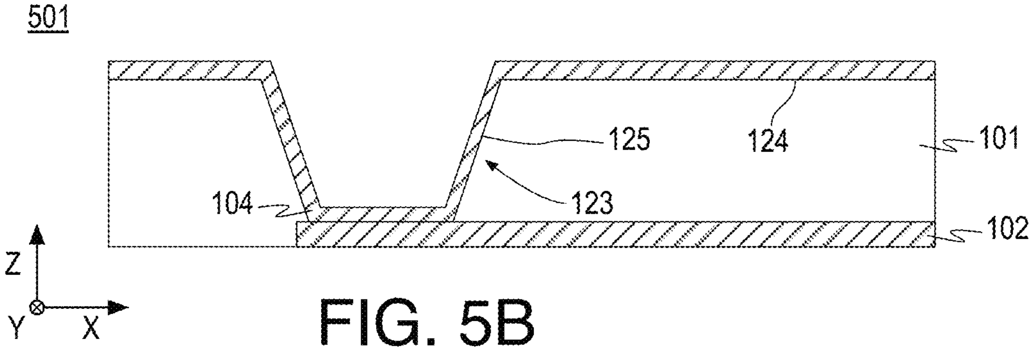

FIG. 5B is a cross-sectional view of a capacitor structure 501 similar to capacitor structure 500 after formation of a conductive layer 104 on top surface 124 and within opening 123. Conductive layer 104 may be any material(s) and may have any characteristics discussed herein. Conductive layer 104 may be formed using any suitable technique or techniques such as electroplating techniques. In some embodiments, a seed layer is formed to facilitate such electroplating.

Figure 5C:
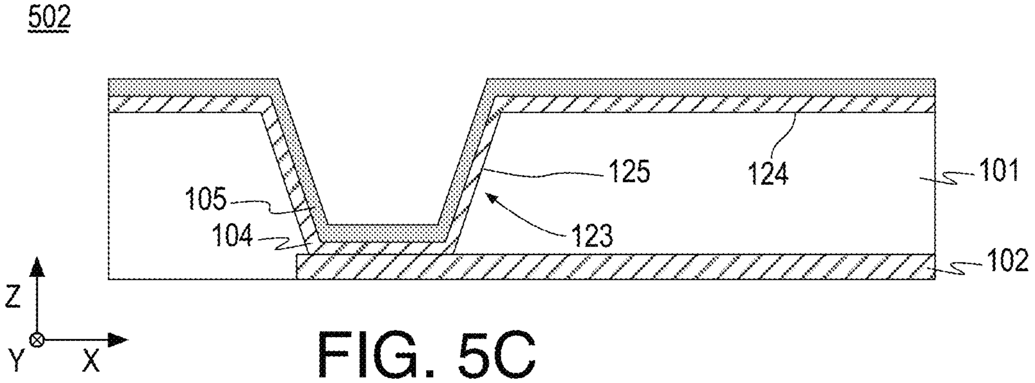

FIG. 5C is a cross-sectional view of a capacitor structure 502 similar to capacitor structure 501 after formation of capacitor dielectric layer 105 on conductive layer 104.

Capacitor dielectric layer 105 may be any material(s) and may have any characteristics discussed herein. Capacitor dielectric layer 105 may be formed using any suitable technique or techniques. In some embodiments, capacitor dielectric layer 105 is deposited using CVD or PVD techniques.

Figure 5D:
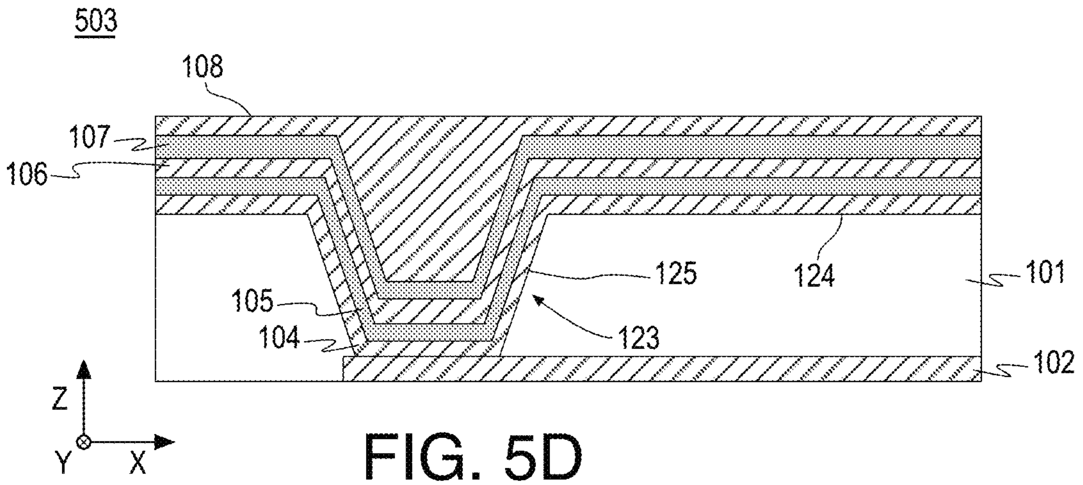

FIG. 5D is a cross-sectional view of a capacitor structure 503 similar to capacitor structure 502 after formation of conductive layer 106, capacitor dielectric layer 107, and conductive layer 108. Conductive layer 106, capacitor dielectric layer 107, and conductive layer 108 may be formed using any suitable technique or techniques discussed with respect to conductive layer 104 and capacitor dielectric layer 105.

Figure 5E:
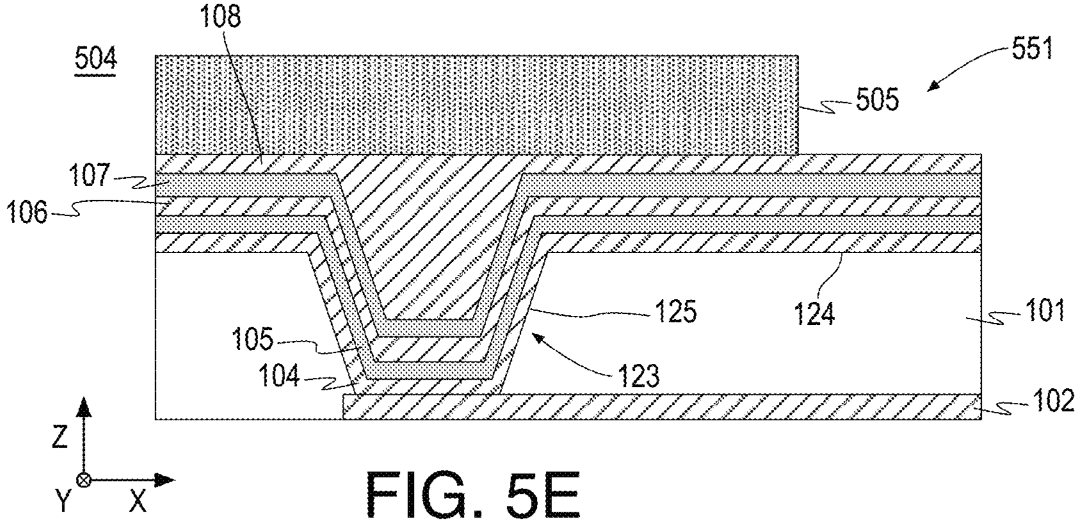

FIG. 5E is a cross-sectional view of a capacitor structure 504 similar to capacitor structure 503 after formation of trimmable patterned layer 505. Trimmable patterned layer 505 may include any suitable materials including resist materials. Notably, trimmable patterned layer 505 may be patterned to providing a patterned layer and trimmable patterned layer 505 may be subsequently trimmed, via etching for example, to reduce the footprint of the patterned layer. Such patterning and footprint reduction may be leveraged to provide a staircase pattern to contact a capacitor structure. Patterned layer 505 may be formed using any suitable technique or techniques such as formation of a bulk material layer and patterning (e.g., exposure and removal of the exposed or unexposed regions). As shown, in some embodiments, patterned layer 505 exposes opening 551 having a size corresponding to a desired etch back of conductive layer 106. It is also noted that, although illustrated with respect to etch back of conductive layer 106, similar processing may be provided to provide an etch back of conductive layer 104, which is not illustrated for the sake of clarity. Alternatively, the stack of conductive layer 104, capacitor dielectric layer 105, conductive layer 106, capacitor dielectric layer 107, and conductive layer 108 may be formed in a region that defines the desired layout of conductive layer 104.

Figure 5F:
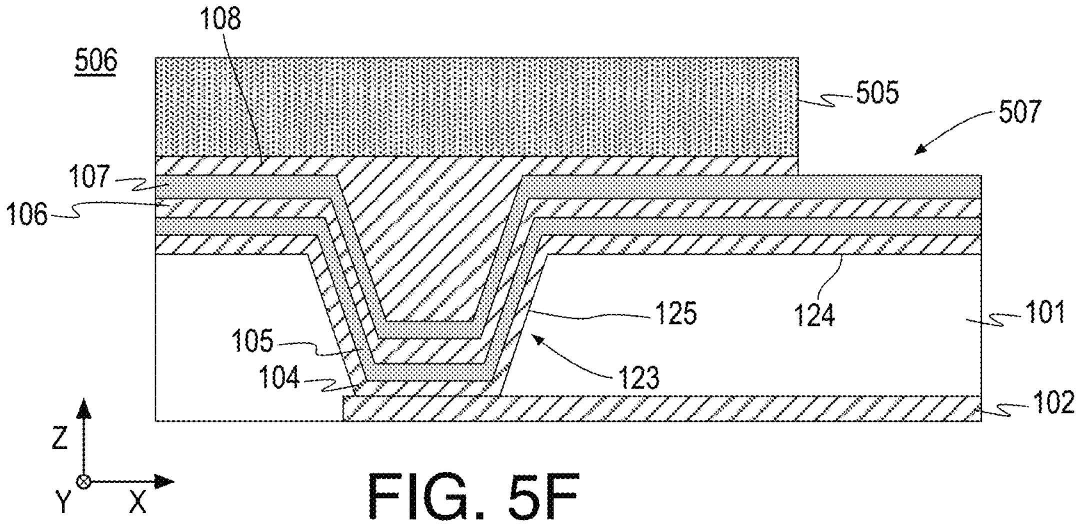
Figure 5G:
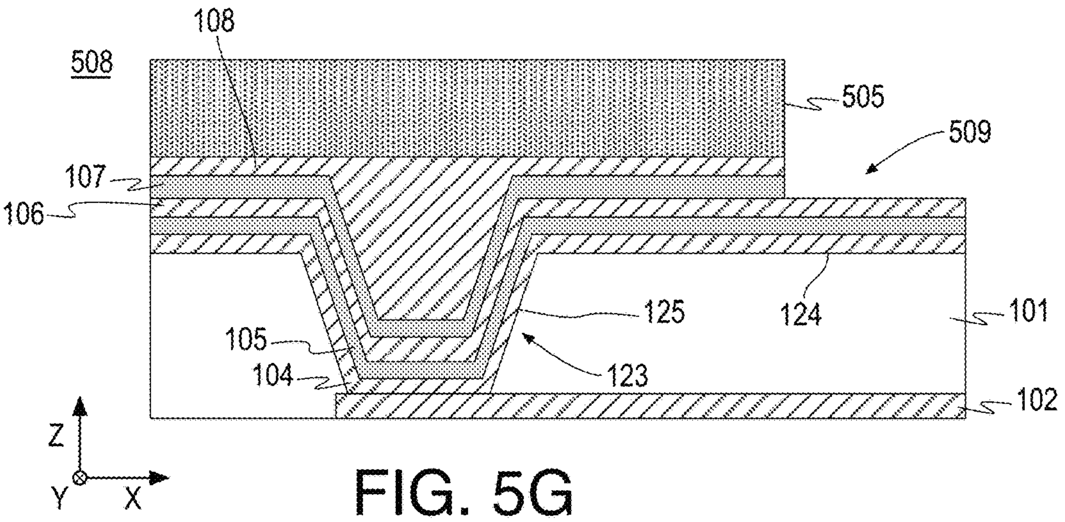

FIG. 5F is a cross-sectional view of a capacitor structure 506 similar to capacitor structure 504 after etch of the exposed portion 507 of conductive layer 108. For example, an etch selective to the metal of conductive layer 108, relative to the dielectric material of capacitor dielectric layer 107, may be performed. As discussed, exposed portion 507 may correspond to the portion of conductive layer 106 that needs to be removed to provide the final desired pattern of conductive layer 106. FIG. 5G is a cross-sectional view of a capacitor structure 508 similar to capacitor structure 506 after etch of the exposed portion 509 of capacitor dielectric layer 107. For example, an etch selective to the dielectric material of capacitor dielectric layer 107, relative to the metal of conductive layer 108, may be performed.

Figure 5H:
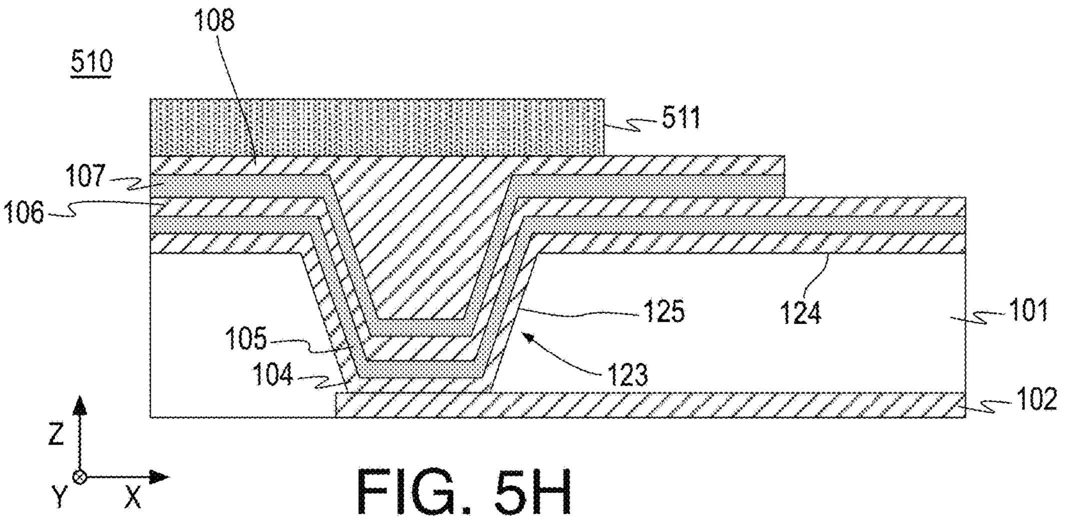

FIG. 5H is a cross-sectional view of a capacitor structure 510 similar to capacitor structure 508 after a trim of trimmable patterned layer 505 to provide a trimmable patterned layer 511 of a reduced size. The trim of trimmable patterned layer 505 may be performed using any suitable technique or techniques such as photolithography (e.g., pattern and resist removal) or a resist trim via etch or other corrosive treatment.

Figure 5I:
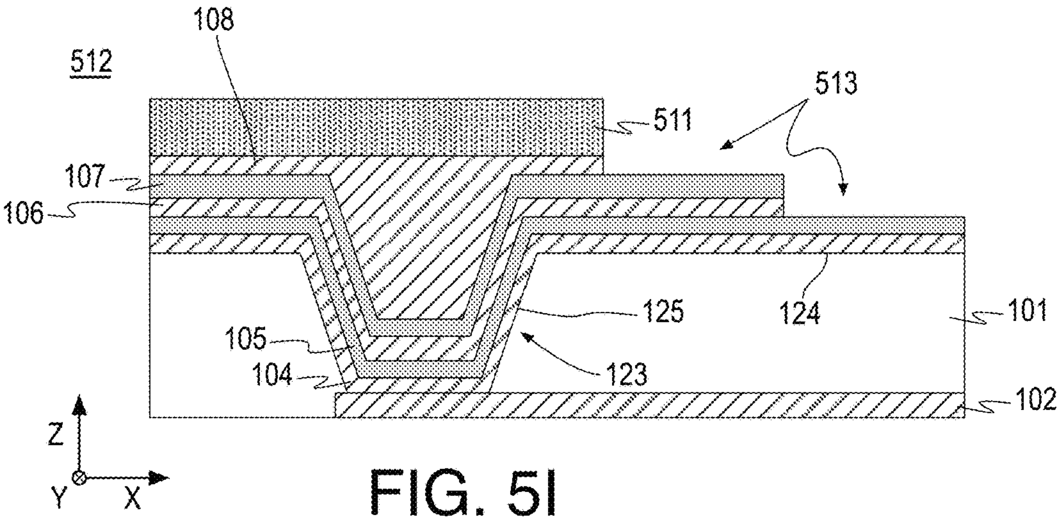
Figure 5J:
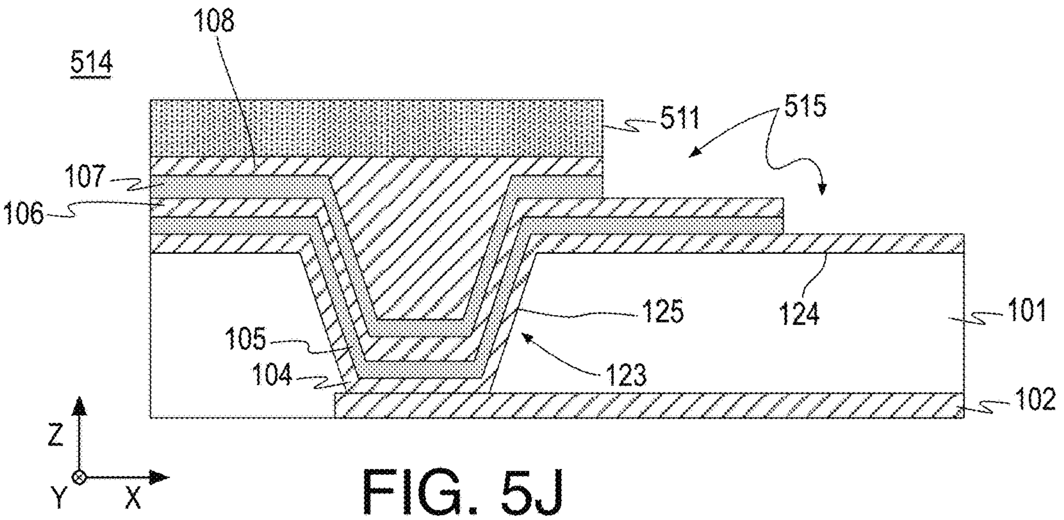

FIG. 5I is a cross-sectional view of a capacitor structure 512 similar to capacitor structure 510 after etch of the exposed portions 513 of conductive layer 108 and conductive layer 106. For example, an etch selective to the metal of conductive layers 106, 108, relative to the dielectric material of capacitor dielectric layers 105, 107, may be performed. As shown, by removing exposed portions 513, conductive layers 104, 106, 108 have the desired pattern to land multiple contacts hereon. FIG. 5J is a cross-sectional view of a capacitor structure 514 similar to capacitor structure 512 after etch of the exposed portions 515 of capacitor dielectric layers 105, 107. For example, an etch selective to the dielectric material of capacitor dielectric layers 105, 107, relative to the metal of conductive layers 104, 106, 108, may be performed.

Figure 5K:
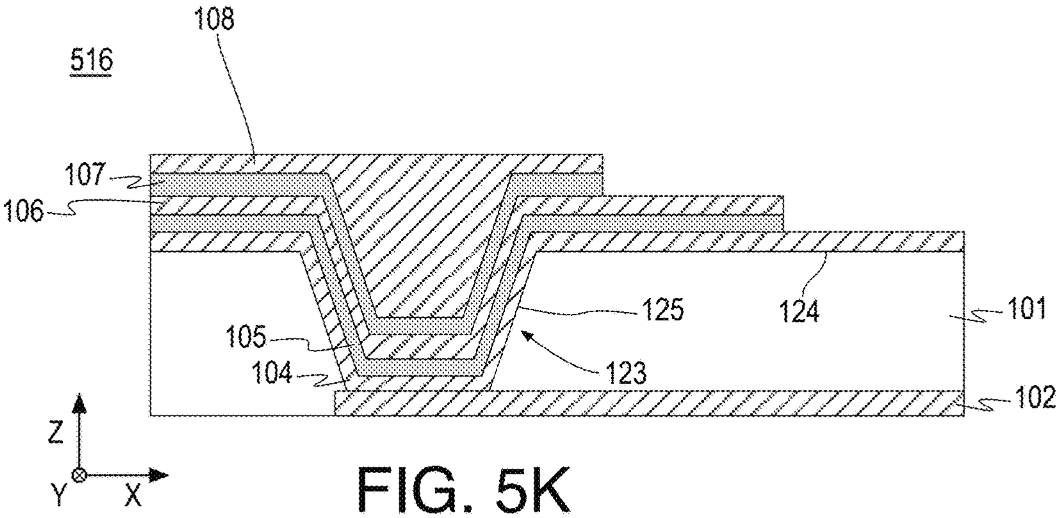

FIG. 5K is a cross-sectional view of a capacitor structure 516 similar to capacitor structure 514 after removal of trimmable patterned layer 511. Trimmable patterned layer 511 may be removed using any suitable technique or techniques such as ash processing.

Figure 5L:
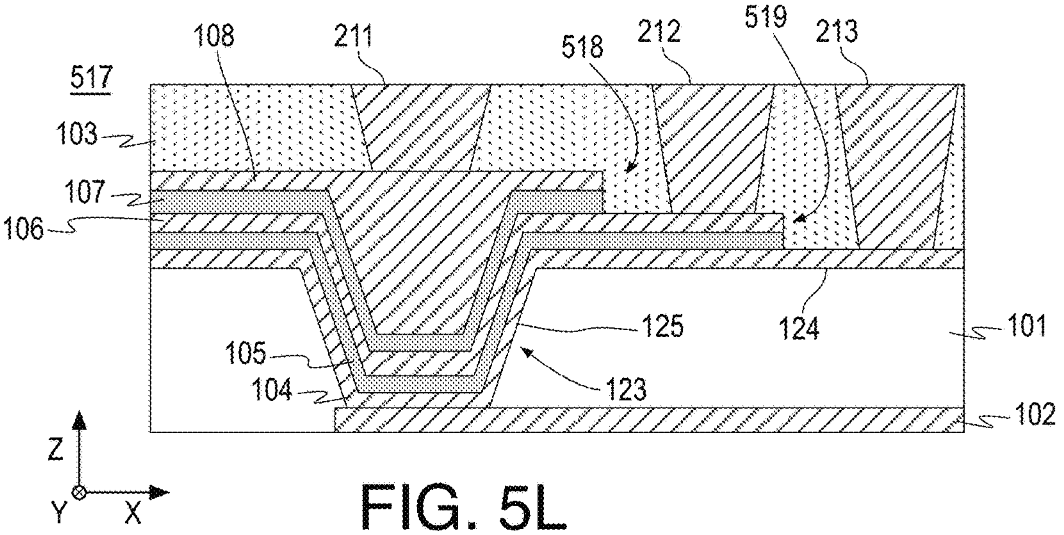

FIG. 5L is a cross-sectional view of a capacitor structure 517 similar to capacitor structure 516 after landing conductive vias 211, 212, 213 on conductive layers 108, 106, 104, respectively, and forming dielectric layer 103. Dielectric layer 103 and conductive vias 211, 212, 213 may be formed using any suitable technique or techniques. In some embodiments, dielectric layer 103 is formed using deposition techniques and then patterned to form openings, which are electroplated to provide conductive vias 211, 212, 213. Other techniques may be used. As shown in FIG. 5L, in some embodiments, edge sidewalls 518 of conductive layer 108 and dielectric layer 107 are vertically aligned and, in a similar manner, edge sidewalls 519 of conductive layer 106 and capacitor dielectric layer 105 are vertically aligned.

Although illustrated with respect to trimmable resist based techniques, capacitor structure 517 may be formed using other techniques including multi-exposure dry film resist based techniques or forming and patterning each layer individually.

Figure 6:
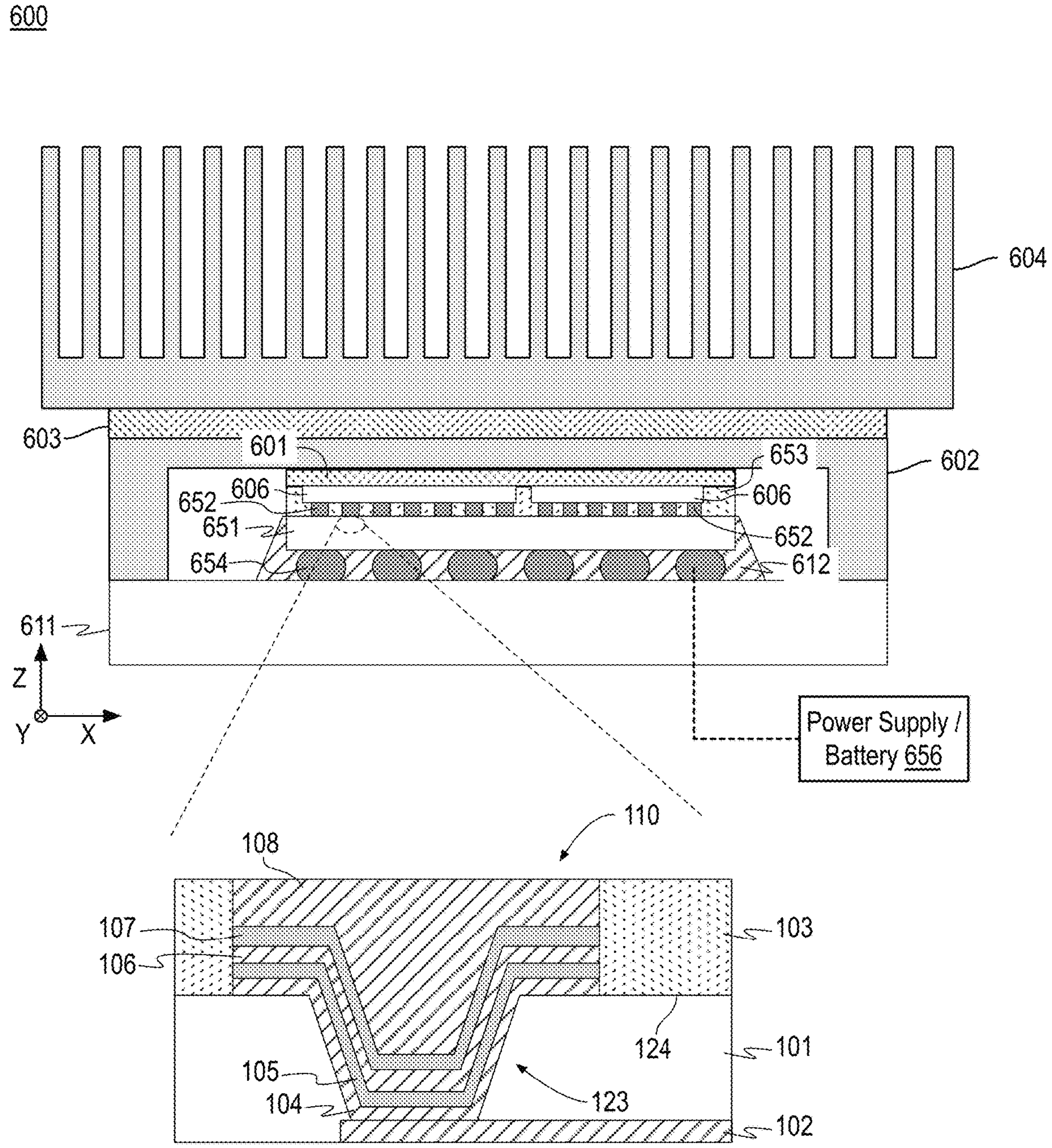
FIG. 6 illustrates an example microelectronic device assembly including a multi-layered capacitor structure.

FIG. 6 illustrates an example microelectronic device assembly 600 including a multi-layered capacitor structure, in accordance with some embodiments. Although illustrated with multi-layered capacitor structure 110, any multi-layered capacitor structure discussed herein, such as multi-layered capacitor structure 210, may be deployed in microelectronic device assembly 600. As shown in FIG. 6, microelectronic device assembly 600 may include any number of integrated circuit dies mounted to package substrate 651 via die level interconnects 652 and optionally embedded in a mold material 653. However, any single IC die, 3D stacked multichip device, multi-chip composite structure, or the like may be deployed in microelectronic device assembly. Package substrate 651 is coupled to a board 611 via package level interconnects 654 and partially encapsulated by underfill material 612.

Microelectronic device assembly 600 further includes a power supply 656 coupled to one or more of board 611, package substrate 651, integrated circuit dies 606, or other components of microelectronic device assembly 600. Power supply 656 may include a battery, voltage converter, power supply circuitry, or the like. Microelectronic device assembly 600 further includes a thermal interface material (TIM) 601 disposed on top surfaces of integrated circuit dies 606. TIM 601 may include any suitable thermal interface material and may be characterized as TIM 1. Integrated heat spreader 602 having a surface on TIM 601 extends over integrated circuit dies 606 and package substrate 651, and is mounted to board. Board 611 may include any suitable substrate such as a motherboard, interposer, or the like. Microelectronic device assembly 600 further includes TIM 603 disposed on a top surface of integrated heat spreader 602. TIM 603 may include any suitable thermal interface material and may be characterized as TIM 2. TIM 601 and TIM 603 may be the same materials, or they may be different. Heat sink 604 (e.g., an exemplary heat dissipation device or thermal solution) is on TIM 603 and dissipates heat. Microelectronic device assembly 600 may be used in desktop and server form factors. In other contexts, a heat solution such as a heat pipe or heat spreader may be mounted directly on TIM 601. Such assemblies may be used in smaller form factor devices. Other heat dissipation devices may be used.

Figure 7:
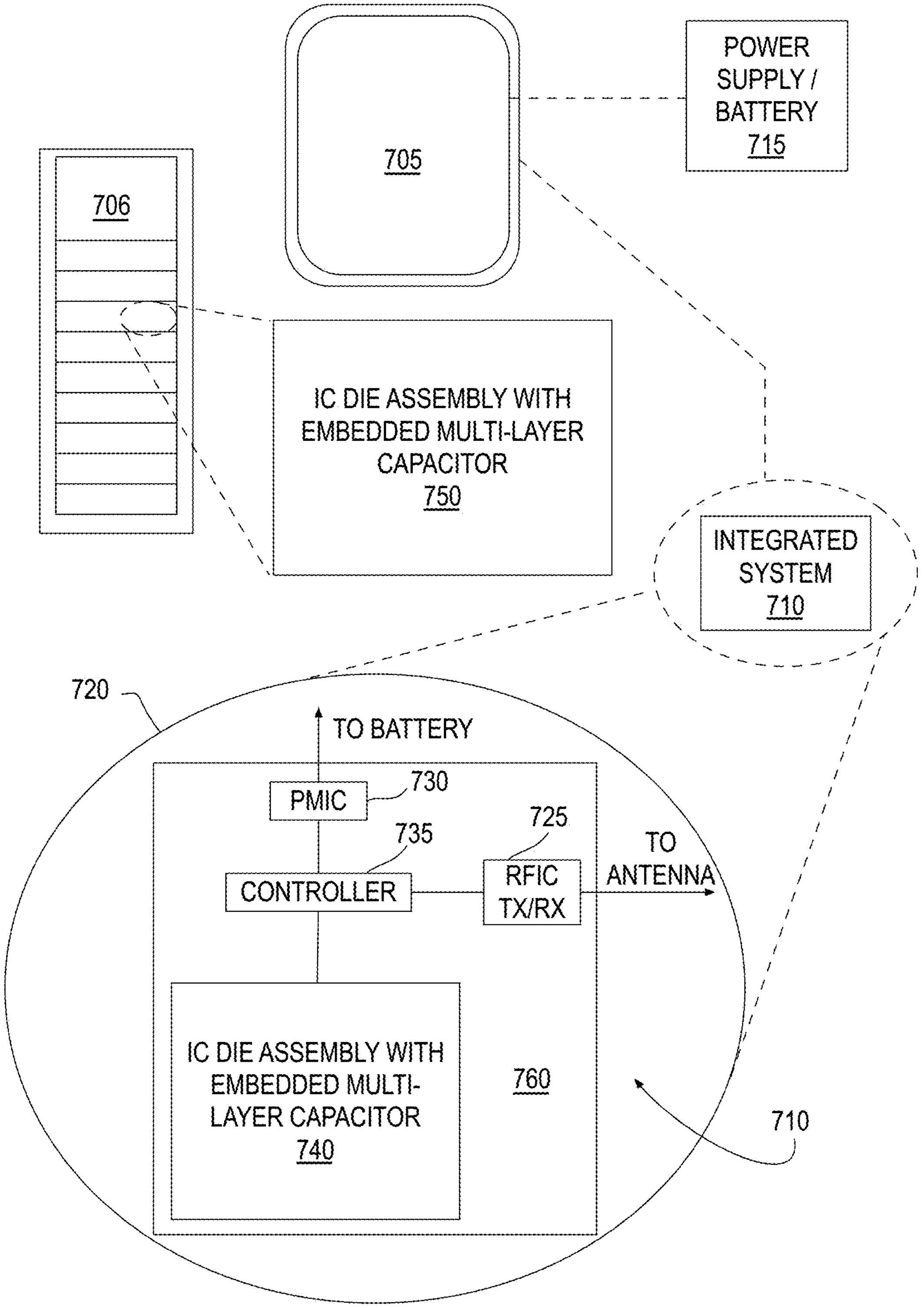
FIG. 7 illustrates exemplary systems deploying a multi-layered in package opening capacitor structure.

FIG. 7 illustrates exemplary systems deploying a multi-layered in package opening capacitor structure, in accordance with some embodiments. The system may be a mobile computing platform 705 and/or a data server machine 706, for example. Either may employ a component assembly including multi-layered in package opening capacitor structure as described herein. Server machine 706 may be any commercial server, for example, including any number of high-performance computing platforms disposed within a rack and networked together for electronic data processing, which in the exemplary embodiment includes an integrated circuit (IC) die assembly 750 with a multi-layered in package opening capacitor structure as described elsewhere herein. Mobile computing platform 705 may be any portable device configured for each of electronic data display, electronic data processing, wireless electronic data transmission, or the like. For example, mobile computing platform 705 may be any of a tablet, a smart phone, a laptop computer, etc., and may include a display screen (e.g., a capacitive, inductive, resistive, or optical touchscreen), a chip-level or package-level integrated system 710, and a battery 715. Although illustrated with respect to mobile computing platform 705, in other examples, chip-level or package-level integrated system 710 and a battery 715 may be implemented in a desktop computing platform, an automotive computing platform, an internet of things platform, or the like. As discussed below, in some examples, the disclosed systems may include a sub-system 760 such as a system on a chip (SOC) or an integrated system of multiple ICs, which is illustrated with respect to mobile computing platform 705.

Whether disposed within integrated system 710 illustrated in expanded view 720 or as a stand-alone packaged device within data server machine 706, sub-system 760 may include memory circuitry and/or processor circuitry 740 (e.g., RAM, a microprocessor, a multi-core microprocessor, graphics processor, etc.), a power management integrated circuit (PMIC) 730, a controller 735, and a radio frequency integrated circuit (RFIC) 725 (e.g., including a wideband RF transmitter and/or receiver (TX/RX)). As shown, one or more IC dice, such as memory circuitry and/or processor circuitry 740 may be packaged, assembled and implemented, such that the package has one or more multi-layered in package opening capacitor structures as described herein. In some embodiments, RFIC 725 includes a digital baseband and an analog front end module further comprising a power amplifier on a transmit path and a low noise amplifier on a receive path). Functionally, PMIC 730 may perform battery power regulation, DC-to-DC conversion, etc., and so has an input coupled to battery 715, and an output providing a current supply to other functional modules. As further illustrated in FIG. 7, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 740 may provide memory functionality for sub-system 760, high level control, data processing and the like for sub-system 760. In alternative implementations, each of the SOC modules may be integrated onto separate ICs coupled to a package substrate, interposer, or board.

Figure 8:
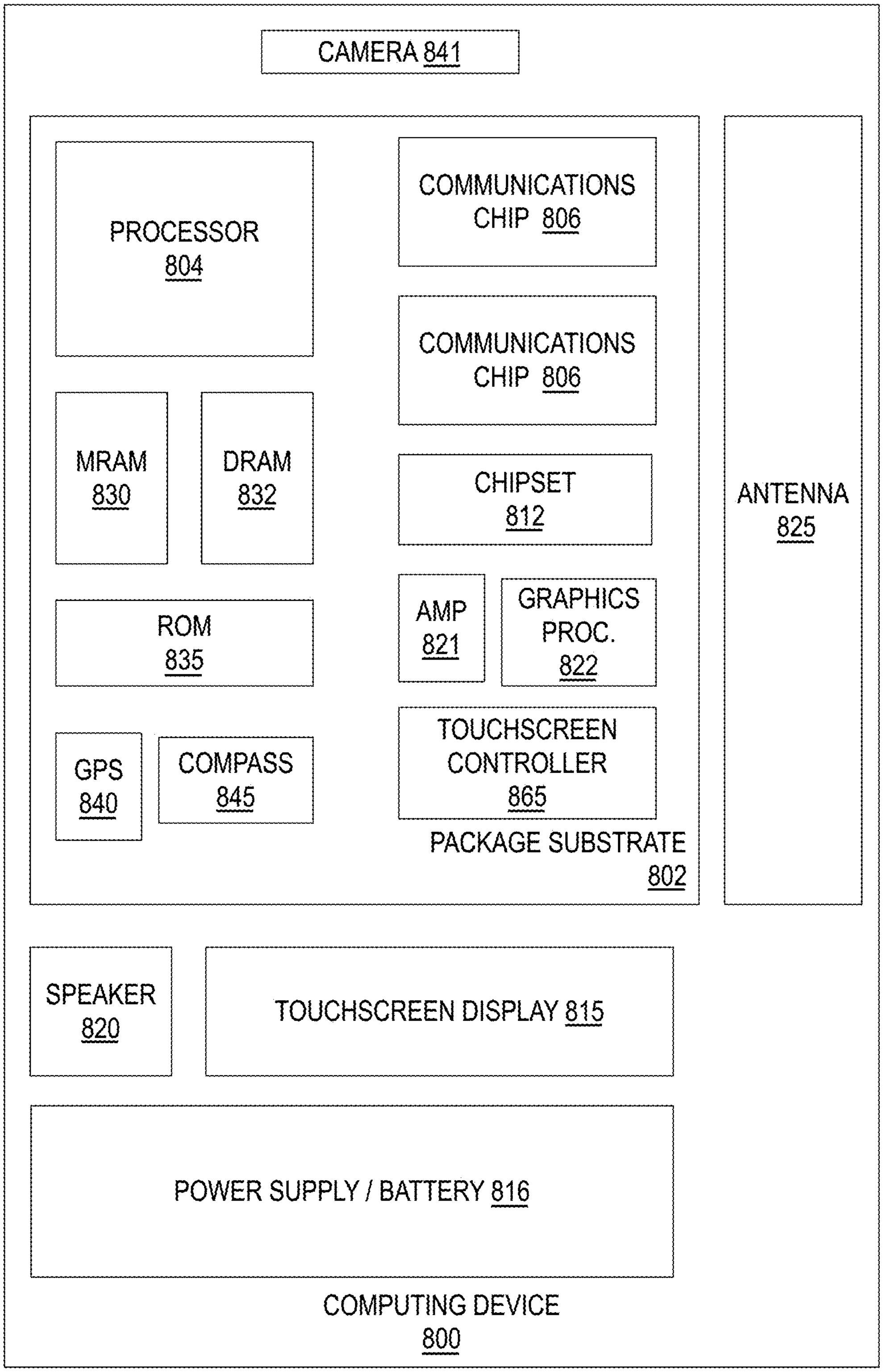
FIG. 8 is a functional block diagram of an electronic computing device, all arranged in accordance with at least some implementations of the present disclosure.

FIG. 8 is a functional block diagram of an electronic computing device 800, in accordance with some embodiments. For example, device 800 may, via any suitable component therein, employ a multi-layered in package opening capacitor structure in accordance with any embodiments described elsewhere herein. Device 800 further includes a motherboard or package substrate 802 hosting a number of components, such as, but not limited to, a processor 804 (e.g., an applications processor). Processor 804 may be physically and/or electrically coupled to package substrate 802. In some examples, processor 804 is within a packaged IC assembly that includes a multi-layered in package opening capacitor structure as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the package substrate 802. In further implementations, communication chips 806 may be part of processor 804. Depending on its applications, computing device 800 may include other components that may or may not be physically and electrically coupled to package substrate 802. These other components include, but are not limited to, volatile memory (e.g., DRAM 832), non-volatile memory (e.g., ROM 835), flash memory (e.g., NAND or NOR), magnetic memory (MRAM 830), a graphics processor 822, a digital signal processor, a crypto processor, a chipset 812, an antenna 825, touchscreen display 815, touchscreen controller 865, battery 816, audio codec, video codec, power amplifier 821, global positioning system (GPS) device 840, compass 845, accelerometer, gyroscope, speaker 820, camera 841, and mass storage device (such as hard disk drive, solid-state drive (SSD), compact disk (CD), digital versatile disk (DVD), and so forth, or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including, but not limited to, those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

The following pertain to exemplary embodiments.

In one or more first embodiments, an apparatus or integrated circuit (IC) package comprises an insulative material layer, the insulative material layer comprising at least a portion of a package substrate or a build-up layer on the package substrate, a multi-layer capacitor structure at least partially within an opening extending through the insulative material layer, the multi-layer capacitor structure comprising at least two capacitor dielectric layers interleaved with a plurality of conductive layers, the least two capacitor dielectric layers at least partially within the opening and a first of the conductive layers on a sidewall of the opening, and first and second terminals coupled to the multi-layer capacitor structure.

In one or more second embodiments, further to the first embodiments, the opening comprises a via opening having a substantially circular cross section.

In one or more third embodiments, further to the first or second embodiments, the opening comprises a trench opening having a length and a substantially orthogonal width, the length not less than three times the width.

In one or more fourth embodiments, further to the first through third embodiments, each of the least two capacitor dielectric layers and the plurality of conductive layers extend over a top surface of the insulative material layer.

In one or more fifth embodiments, further to the first through fourth embodiments, the first terminal comprises a metallization layer in contact with the first conductive layer under the opening, wherein the sidewall extends from the metallization layer to a top surface of the insulative material layer.

In one or more sixth embodiments, further to the first through fifth embodiments, the second terminal comprises a second conductive layer of the plurality of conductive layers.

In one or more seventh embodiments, further to the first through sixth embodiments, the conductive layers comprise a metal.

In one or more eighth embodiments, further to the first through seventh embodiments, the capacitor dielectric layers comprise one of silicon and oxygen or silicon and nitrogen.

In one or more ninth embodiments, further to the first through eighth embodiments, the insulative material layer comprises the portion of the package substrate, the package substrate comprising an inorganic package substrate.

In one or more tenth embodiments, an apparatus or IC package comprises an insulative material layer, the insulative material layer comprising at least a portion of a package substrate or a build-up layer on the package substrate, a multi-layer capacitor structure at least partially within an opening extending through the insulative material layer, the multi-layer capacitor structure comprising at least two capacitor dielectric layers interleaved with conductive layers, the least two capacitor dielectric layers at least partially within the opening, a first conductive via in contact with a first conductive layer of the conductive layers at a first distance from the opening along a top surface of the insulative material layer, and a second conductive via in contact with a second conductive layer of the conductive layers at a second distance, less than the first distance, from the opening along the top surface of the insulative material layer.

In one or more eleventh embodiments, further to the tenth embodiments, the second conductive layer is over the first conductive layer and separated by a first capacitor dielectric layer of the at least two capacitor dielectric layers therebetween.

In one or more twelfth embodiments, further to the tenth or eleventh embodiments, apparatus or IC package further comprises a third conductive via in contact with a third conductive layer of the conductive layers at a position above the opening.

In one or more thirteenth embodiments, further to the tenth through twelfth embodiments, apparatus or IC package further comprises a metallization layer in contact with the first conductive layer at a position below the opening, wherein a sidewall at least partially defining the opening extends from the first conductive layer to the top surface of the insulative material layer.

In one or more fourteenth embodiments, further to the tenth through thirteenth embodiments, the conductive layers comprise a metal and the capacitor dielectric layers comprise one of silicon and oxygen or silicon and nitrogen.

In one or more fifteenth embodiments, further to the tenth through fourteenth embodiments, the opening comprises a via opening having a substantially circular cross section.

In one or more sixteenth embodiments, a system comprises an IC die according to any of the IC packages of the first through sixteenth embodiments, further including an IC device over and electrically coupled to the package substrate and a power supply coupled to the IC device.

In one or more seventeenth embodiments, a system comprises a package substrate and a multi-layer capacitor at least partially embedded therein, the multi-layer capacitor comprising a multi-layer capacitor structure at least partially within an opening extending through at least a portion of the package substrate or a build-up layer thereon, the multi-layer capacitor structure comprising at least two capacitor dielectric layers interleaved with a plurality of conductive layers, the least two capacitor dielectric layers at least partially within the opening, and first and second terminals coupled to the multi-layer capacitor structure, and an integrated circuit device over and electrically coupled to the package substrate.

In one or more eighteenth embodiments, further to the seventeenth embodiments, a package level interconnect of the integrated circuit device is in contact with the first terminal.

In one or more nineteenth embodiments, further to the seventeenth or eighteenth embodiments, the opening comprises a via opening having a substantially circular cross section.

In one or more twentieth embodiments, further to the seventeenth through nineteenth embodiments, the first terminal comprises a first conductive via in contact with a first conductive layer of the conductive layers at a first distance from the opening, and the second terminal comprises a second conductive via in contact with a second conductive layer of the conductive layers at a second distance, less than the first distance, from the opening.

In one or more twenty-first embodiments, further to the seventeenth through twentieth embodiments, the multi-layer capacitor further comprises a third conductive via in contact with a third conductive layer of the conductive layers at a position above the opening.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:

a package substrate comprising a glass core;

an opening within the glass core, the opening extending at least partially through the glass core;

a multi-layer capacitor structure at least partially within the opening of the glass core of the package substrate, the multi-layer capacitor structure comprising at least two capacitor dielectric layers interleaved with a plurality of conductive layers, the at least two capacitor dielectric layers at least partially within the opening and a first conductive layer of the plurality of conductive layers on a sidewall of the opening; and first and second terminals coupled to the multi-layer capacitor structure.

2. The apparatus of claim 1, wherein the opening comprises a via opening having a substantially circular cross section, or the opening comprises a trench opening having a length and a substantially orthogonal width, the length not less than three times the substantially orthogonal width.

3. The apparatus of claim 1, wherein the first terminal is a first conductive via in contact with the first conductive layer or a second conductive layer of the plurality of conductive layers at a first distance from the opening along a top surface of the glass core, and the second terminal is a second conductive via in contact with a third conductive layer of the plurality of conductive layers at a second distance, less than the first distance, from the opening along the top surface of the glass core.

4. The apparatus of claim 1, wherein each of the at least two capacitor dielectric layers and the plurality of conductive layers extend over a top surface of the glass core.

5. The apparatus of claim 1, wherein the first terminal comprises a metallization layer in contact with the first conductive layer under the opening, wherein the sidewall extends from the metallization layer to a top surface of the glass core.

6. The apparatus of claim 1, wherein the plurality of conductive layers comprise a metal, and the at least two capacitor dielectric layers comprise one of silicon and oxygen or silicon and nitrogen.

7. The apparatus of claim 1, further comprising an integrated circuit device over and electrically coupled to the package substrate.

8. An apparatus, comprising:

a package substrate comprising a plurality of organic layers;

an opening within and extending at least partially through the plurality of organic layers of the package substrate;

a multi-layer capacitor structure at least partially within the opening of the plurality of organic layers of the package substrate, the multi-layer capacitor structure comprising at least two capacitor dielectric layers interleaved with a plurality of conductive layers, the at least two capacitor dielectric layers at least partially within the opening and a first conductive layer of the plurality of conductive layers on a sidewall of the opening; and first and second terminals coupled to the multi-layer capacitor structure.

9. The apparatus of claim 8, wherein the opening comprises a via opening having a substantially circular cross section, or the opening comprises a trench opening having a length and a substantially orthogonal width, the length not less than three times the substantially orthogonal width.

10. The apparatus of claim 8, wherein the first terminal is a first conductive via in contact with a first conductive layer or a second conductive layer of the plurality of conductive layers at a first distance from the opening along a top surface of the plurality of organic layers, and the second terminal is a second conductive via in contact with a third conductive layer of the plurality of conductive layers at a second distance, less than the first distance, from the opening along the top surface of the plurality of organic layers.

11. The apparatus of claim 8, wherein each of the at least two capacitor dielectric layers and the plurality of conductive layers extend over a top surface of the plurality of organic layers.

12. The apparatus of claim 8, wherein the first terminal comprises a metallization layer in contact with the first conductive layer under the opening, wherein the sidewall extends from the metallization layer to a top surface of the plurality of organic layers.

13. The apparatus of claim 8, wherein the plurality of conductive layers comprise a metal, and the at least two capacitor dielectric layers comprise one of silicon and oxygen or silicon and nitrogen.

14. The apparatus of claim 8, further comprising an integrated circuit device over and electrically coupled to the package substrate.

15. An apparatus, comprising:

a package substrate comprising an insulative material layer on a glass core layer;

an opening within and extending through the insulative material layer of the package substrate;

a multi-layer capacitor structure at least partially within the opening of the insulative material layer of the package substrate, the multi-layer capacitor structure comprising at least two capacitor dielectric layers interleaved with a plurality of conductive layers, the at least two capacitor dielectric layers at least partially within the opening and a first conductive layer of the plurality of conductive layers on a sidewall of the opening; and first and second terminals coupled to the multi-layer capacitor structure.

16. The apparatus of claim 15, wherein the opening comprises a via opening having a substantially circular cross section, or the opening comprises a trench opening having a length and a substantially orthogonal width, the length not less than three times the substantially orthogonal width.

17. The apparatus of claim 15, wherein the first terminal is a first conductive via in contact with a first conductive layer or a second conductive layer of the plurality of conductive layers at a first distance from the opening along a top surface of the insulative material layer, and the second terminal is a second conductive via in contact with a third conductive layer of the plurality of conductive layers at a second distance, less than the first distance, from the opening along the top surface of the insulative material layer.

18. The apparatus of claim 15, wherein each of the at least two capacitor dielectric layers and the plurality of conductive layers extend over a top surface of the insulative material layer.

19. The apparatus of claim 15, wherein the first terminal comprises a metallization layer in contact with the first conductive layer under the opening, wherein the sidewall extends from the metallization layer to a top surface of the insulative material layer.

20. The apparatus of claim 15, wherein the plurality of conductive layers comprise a metal, and the at least two capacitor dielectric layers comprise one of silicon and oxygen or silicon and nitrogen.

21. The apparatus of claim 15, further comprising an integrated circuit device over and electrically coupled to the package substrate.

* * * * *